United States Patent
Brunner (12)

(10) Patent No.: US 6,451,124 B1
(45) Date of Patent: Sep. 17, 2002

(54) PROCESS FOR THE CHEMICAL TREATMENT OF SEMICONDUCTOR WAFERS

(75) Inventor: Roland Brunner, Reut (DE)

(73) Assignee: Wacker Siltronic Gesellschaft fur Halbleiterma Terialien AG, Burghausen (DE)

( * ) Notice: Subject to any disclaimer, the term of this patent is extended or adjusted under 35 U.S.C. 154(b) by 0 days.

(21) Appl. No.: 09/882,207

(22) Filed: Jun. 15, 2001

(30) Foreign Application Priority Data

Jul. 27, 2000 (DE) .......................... 100 36 691

(51) Int. Cl.[7] ................................. C23G 1/02
(52) U.S. Cl. ...................... 134/3; 134/2; 134/26; 134/28; 134/30; 134/31; 134/36; 134/41; 134/42; 134/902
(58) Field of Search .................. 134/2, 3, 26, 31, 134/28, 30, 36, 41, 42, 902

(56) References Cited

U.S. PATENT DOCUMENTS

| | | | | |
|---|---|---|---|---|
| 5,318,706 A | * | 6/1994 | Ohmi et al. | 210/649 |
| 5,626,681 A | * | 5/1997 | Nakano et al. | 134/3 |
| 5,662,743 A | | 9/1997 | Nakano et al. | 134/3 |
| 5,665,168 A | | 9/1997 | Nakano et al. | 134/2 |
| 5,714,203 A | * | 2/1998 | Schellenberger et al. | 427/378 |
| 5,759,971 A | * | 6/1998 | Manako | 510/175 |
| 5,810,940 A | * | 9/1998 | Fukazawa et al. | 134/3 |
| 5,944,907 A | * | 8/1999 | Ohmi | 134/1.3 |
| 6,131,588 A | * | 10/2000 | Kamikawa et al. | 134/102.3 |
| 6,165,279 A | * | 12/2000 | Tsao et al. | 134/3 |
| 2001/0003680 A1 | * | 6/2001 | Brunner et al. | |
| 2002/0023664 A1 | * | 2/2002 | Brunner | |

FOREIGN PATENT DOCUMENTS

| | | |
|---|---|---|
| DE | 19531031 | 8/1997 |
| DE | 19723918 | 5/1998 |
| DE | 198534486 | 5/2000 |
| EP | 0438727 | 7/1991 |
| EP | 0683509 A2 * | 11/1995 |
| EP | 700 077 | 3/1996 |
| EP | 708480 | 4/1996 |
| EP | 782177 | 7/1997 |
| JP | 62-198127 | 9/1987 |
| JP | 4-113620 | 4/1992 |
| JP | 2000-100777 | 4/2000 |

OTHER PUBLICATIONS

Patent Abstracts of Japan, vol. 2000, No. 07, Sep. 29, 2000 Conesp. to JP 2000–100777.
Patent Abstracts of Japan, vol. 012, No. 049 (E–582), Feb. 31, 1988 Conesp. to JP 62–198127.
Patent Abstract of Japan, vol. 016, No. 360 (E1243) Aug. 4, 1992 Conesp. to JP 4113620.
Tardif F. et al.: "Optimization of HF Cast and Oxidant Web Cleanings for 7nm Gate Oxide" Microelectronic Engineering, Esevier Publishers BV., Amsterdam, NL vol. 28, No. 1, 611195, pp. 121–124, XP004011866 ISSN:0167–9317.
For JP 2000–100777 A a. Patent Abstracts of Japan in English Language is enclosed.
Patent Abstract of Japan Corres. to JP 8–160032 A.
Patent Abstract of Japan Corresp. to JP 3–66126 A.
English Derwent Abstract Corresp. to EP 0 438 727 A2.
English Derwent Abstract Corresp. to DE 195 31031 C2.
English Derwent Abstract Corresp. to DE 197 23 918 A1.
English Derwent Abstract, Corresp. to DE 19853486 A.

* cited by examiner

*Primary Examiner*—Sharidan Carrillo
(74) *Attorney, Agent, or Firm*—Collard & Roe, P.C.

(57) ABSTRACT

A process for the chemical treatment of semiconductor wafers in the presence of HF and then in the presence of ozone, in particular for the cleaning of silicon semiconductor wafers, is such that the semiconductor wafers that are treated with the medium containing ozone are free of aqueous HF.

6 Claims, No Drawings

PROCESS FOR THE CHEMICAL TREATMENT OF SEMICONDUCTOR WAFERS

BACKGROUND OF THE INVENTION

1. Field of the Invention

The present invention relates to a process for the chemical treatment of semiconductor wafers in the presence of HF and then in the presence of ozone, in particular for the cleaning of silicon semiconductor wafers.

2. The Prior Art

Processes for the wet chemical treatment of semiconductor wafers are already known. Regarding these processes, reference may, for example, be made to DE-A 19853486 and U.S. Pat. No. 5,662,743. The disclosure of these references relate to removing metallic contamination and particles from semiconductor wafers. This contamination generally interferes with the surface structure pattern.

SUMMARY OF THE INVENTION

The present invention relates to a process for the chemical treatment of semiconductor wafers, in which the semiconductor wafers are treated with a medium containing HF and then with a medium containing ozone, wherein the semiconductor wafers that are treated with the medium containing ozone are free of aqueous HF.

The medium containing HF which is used in the process according to the invention may be either pure hydrogen fluoride or an aqueous solution of hydrogen fluoride, i.e. hydrofluoric acid. In both cases the medium containing HF may be in the gas phase or in the liquid phase. The medium containing HF which is used according to the present invention is preferably an aqueous HF solution, particularly preferably one that contains HF in a concentration of from 0.001% to 10% by weight. The aqueous HF solution which is used according to the invention may also contain HCl in a concentration of from 0.001% to 10% by weight, preferably from 0.2% to 2.0% by weight. Apart from HF, optionally water and optionally HCl, the medium containing HF which is used according to the present invention preferably does not contain any other substances, for example surfactants.

Regarding the above mentioned HF concentration or HCl concentration, the percent by weight for the HF is based upon the total weight of the aqueous solution. The percent by weight for the HCl is based upon the total weight of the aqueous solution.

The medium containing ozone which is used in the process according to the invention may be either $O_3$ gas or an aqueous $O_3$ solution. The medium containing ozone which is used according to the invention is preferably an aqueous $O_3$ solution, particularly preferably solutions that contain $O_3$ in a concentration of from 1 to 50 ppm.

If aqueous HF solutions and/or aqueous ozone solutions are used in the process according to the present invention, it is preferable to employ solutions that have been prepared using deionized water.

In the process according to the present invention, the treatment with the medium containing ozone directly follows the treatment with the medium containing HF, without any additional step of washing with water. The omission of washing with water between the treatments with the chemically active agents offers immediate economic advantages and substantially improves the cleaning action on the Si surface. The oxidizing action of ozone on the Si surface is also improved by the process according to the present invention.

The semiconductor wafers used in the process according to the invention, which have been treated with a medium containing HF and are free of aqueous HF, can be obtained as a result of either carrying out the treatment with the medium containing HF
 a) by using HF gas or
 b) after the treatment in the aqueous HF bath has been carried out, separating the semiconductor wafer from the latter in such a way that there is no longer any aqueous HF on the surface of the semiconductor wafer.

In the process variant a) the semiconductor wafers are exposed to an HF gas stream in a sealed device, and the residual HF gas is pumped out at the end of the treatment stage. The semiconductor wafers obtained in this way can then be processed using ozone gas in a second step. The residual ozone gas is pumped out after the ozone-gas treatment stage.

In the process according to the invention, the semiconductor wafer treated with HF can be separated from the aqueous HF bath according to the process variant b) by
 b1) extracting the aqueous HF solution from the treatment bath or
 b2) extracting the treated semiconductor wafers from the aqueous HF bath.

In the process according to the present invention, in the variant b1) the aqueous HF solution is preferably discharged from the process bath into a temporary container at a rate which lowers the level of the liquid by preferably from 0.01 to 15 mm per second and more particularly from 0.01 to 0.5 mm per second. In this case, the HF solution is preferably discharged a valve that has a controllable cross section. After the HF solution has been fully drained from the bath, the semiconductor wafers that are free of HF solution are immersed in the next medium containing ozone. The HF solution is cleaned in the temporary container, preferably by using 0.05 $\mu$m recycling filtration, and fed back into the process bath. The filtered HF solution is again ready to clean semiconductor wafers.

In the process according to the present invention, in the variant b2) the treated semiconductor wafers are drawn at a speed of preferably from 0.01 to 15 mm per second and more particularly from 0.01 to 0.5 mm per second through the surface of the aqueous HF solution, advantageously by using an automated handling device. The semiconductor wafers obtained in this way, which are free of HF solution, are subsequently immersed in the next medium containing ozone, and uniformly rendered hydrophilic.

The process according to the present invention is carried out at a temperature of preferably from 10 to 65° C., particularly preferably from 20 to 30° C., and at a pressure of preferably from 900 to 1100 hPa.

The treatment sequences according to the present invention may—if desired—be preceded or followed by other standard operations for the chemical treatment of semiconductor wafers, for example treatment to dry the semiconductor wafers after the ozone treatment has been carried out.

The present invention provides a process with which semiconductor wafers can be conditioned particularly effectively for the defect-free growth of thermal oxides.

The process according to the present invention has the advantage that the native oxide grows very uniformly over the entire Si surface during the ozone hydrophilization. The oxide advantageously contains no defect sites in the native oxide, which cause nonuniform thermal oxidation in the nm range. According to the requirement of the subsequent processing in the IC industry, very thin or thick oxide layers are applied to the semiconductor wafer. The thermally produced oxide layers grow uniformly and without defect regions.

The process according to the present invention also has the advantage that the Si surface of the semiconductor wafer is free of regions with different microroughness (haze) due to residual aqueous HF solution in combination with aqueous ozone solution.

DETAILED DESCRIPTION OF PREFERRED EMBODIMENTS

Other objects and features of the present invention will become apparent from the following detailed description considered in connection with the accompanying Examples which disclose several embodiments of the present invention. It should be understood, however, that the Examples are designed for the purpose of illustration only and not as a definition of the limits of the invention.

EXAMPLE 1

50 silicon semiconductor wafers, with a diameter of 200 mm, each were immersed in 50 l of aqueous HF solution with an HF concentration of 0.2% by weight and, after a period of 5 minutes, were drawn from the HF solution at a pulling rate of 0.5 mm/s. The semiconductor wafers obtained in this way were then immersed for a period of 5 minutes in 50 l of aqueous ozone solution with an ozone concentration of 6 ppm.

The semiconductor wafers treated in this way were then subjected to thermal poly/LTO oxidation which is known per se. The quality of the oxide uniformity was assessed by visual inspection under haze light. The number of semiconductor wafers having nonuniform oxide faces was approximately 0.

Comparative Example 1

The procedure described in Example 1 was repeated, with the difference that the rate at which the semiconductor wafers were drawn from the HF bath was 50 mm/s instead of 0.5 mm/s.

The number of semiconductor wafers having nonuniform oxide faces, primarily at the positions where the HF solution adhered to the semiconductor wafers before immersion in the ozone solution, was in the 80% range.

Accordingly, while a few embodiments of the present invention have been shown and described, it is to be understood that many changes and modifications may be made thereunto without departing from the spirit and scope of the invention as defined in the appended claims.

What is claimed is:

1. A process for the chemical treatment of semiconductor wafers comprising the sequential steps of:
   a) providing a treatment bath consisting of an aqueous HF solution;
   b) providing semiconductor wafers in said treatment bath;
   c) treating said semiconductor wafers with said aqueous HF solution in said treatment bath;
   d) separating said semiconductor wafers, after said treatment with said aqueous HF solution, from said aqueous HF solution at a speed of from 0.01 to 0.5 mm/sec so that there is no longer any of said aqueous HF solution on surfaces of said semiconductor wafers; and
   e) treating said semiconductor wafers with a medium containing ozone, wherein the semiconductor wafers that are treated with said medium containing ozone are free of said aqueous HF solution.

2. The process as claimed in claim 1, wherein said aqueous HF solution has a concentration of from 0.001% to 10% by weight based upon the total weight of the aqueous solution.

3. The process as claimed in claim 1, wherein an aqueous $O_3$ solution is employed as the medium containing ozone.

4. The process as claimed in claim 1, wherein said semiconductor wafers treated with said aqueous HF solution are separated from said aqueous HF solution by discharging said aqueous HF solution from the treatment bath at said speed of from 0.01 to 0.5 mm/sec.

5. The process as claimed in claim 1, wherein said semiconductor wafers treated with said aqueous HF solution are separated from said aqueous HF solution by withdrawing said treated semiconductor wafers from said aqueous HF treatment bath at said speed of from 0.01 to 0.5 mm/sec.

6. The process as claimed in claim 3, wherein said aqueous $O_3$ solution has a concentration of from 1 to 50 ppm.

* * * * *